(12) United States Patent
Hirasawa et al.

(10) Patent No.: US 7,345,369 B2
(45) Date of Patent: Mar. 18, 2008

(54) SEMICONDUCTOR DEVICE HAVING SEMICONDUCTOR CHIP ON BASE THROUGH SOLDER LAYER AND METHOD FOR MANUFACTURING THE SAME

(75) Inventors: Naoki Hirasawa, Okazaki (JP);
Sadahisa Onimaru, Chiryu (JP);
Hirohito Matsui, Okazaki (JP);
Kuniaki Mamitsu, Okazaki (JP);
Naohiko Hirano, Okazaki (JP)

(73) Assignees: DENSO CORPORATION, Kariya (JP); Nippon Soken, Inc, Nishio (JP)

( * ) Notice: Subject to any disclaimer, the term of this patent is extended or adjusted under 35 U.S.C. 154(b) by 0 days.

(21) Appl. No.: 11/248,263

(22) Filed: Oct. 13, 2005

(65) Prior Publication Data

US 2006/0087043 A1    Apr. 27, 2006

(30) Foreign Application Priority Data

Oct. 21, 2004    (JP)    ............................. 2004-306780

(51) Int. Cl.
*H01L 23/36*    (2006.01)

(52) U.S. Cl. ...................................... 257/782; 257/779

(58) Field of Classification Search ..................... None
See application file for complete search history.

(56) References Cited

U.S. PATENT DOCUMENTS 5,361,973 A    11/1994    Ishii et al.

6,122,177 A    9/2000    Kitano et al.
6,448,646 B1    9/2002    Kitano et al.

FOREIGN PATENT DOCUMENTS

| JP | A-54-037572 | 3/1979 |
|---|---|---|
| JP | A-2-144928 | 6/1990 |
| JP | A-2003-151998 | 5/2003 |
| JP | 2004146512 A * | 5/2004 |

* cited by examiner

*Primary Examiner*—Leonardo Andujar
(74) *Attorney, Agent, or Firm*—Posz Law Group, PLC

(57) ABSTRACT

A semiconductor device includes: a base member; a solder layer; and a semiconductor chip disposed on the base member through the solder layer. The chip has an in-plane temperature distribution when the chip is operated. The chip has an allowable maximum temperature as a temperature limit of operation. The in-plane temperature distribution of the chip provides a temperature of the chip at each position of a surface of the chip. The temperature margin at each position is obtained by subtracting the temperature of the chip from the allowable maximum temperature. The solder layer has an allowable maximum diameter of a void at each position, the void being disposed in the solder layer. The allowable maximum diameter of the void at each position becomes larger as the temperature margin at the position becomes larger.

6 Claims, 4 Drawing Sheets

SEMICONDUCTOR DEVICE HAVING SEMICONDUCTOR CHIP ON BASE THROUGH SOLDER LAYER AND METHOD FOR MANUFACTURING THE SAME

CROSS REFERENCE TO RELATED APPLICATION

This application is based on Japanese Patent Application No. 2004-306780 filed on Oct. 21, 2004, the disclosure of which is incorporated herein by reference.

FIELD OF THE INVENTION

The present invention relates to a semiconductor device having a semiconductor chip on a base through a solder layer and a method for manufacturing the same.

BACKGROUND OF THE INVENTION

A semiconductor device includes a base and a semiconductor chip bonded to the base through a solder layer made of solder material. Here, the base is formed of a circuit board. Solder material between the chip and the base is heated and reflowed so that the solder layer is formed. Thus, the semiconductor chip and the base are bonded together.

When the device is operated, the semiconductor chip generates heat. The heat is discharged from the base through the solder layer. However, when the solder layer includes voids, heat radiation path is disturbed by the voids, so that the heat is not effectively discharged. Thus, the temperature of the chip increases, and therefore, the temperature of the chip may exceed over the maximum allowable temperature of the chip. Accordingly, cooling performance of the chip is decreased by the voids.

A method for bonding the chip on the base with reducing the voids in the solder layer is disclosed in, for example, Japanese Laid-open Patent Publication No. H6-23534, which corresponds to U.S. Pat. No. 5,361,973.

However, it is difficult to remove the voids from the solder layer completely.

Further, there is no disclosure to bond the chip on the base with high cooling performance of the chip even when the voids exist in the solder layer. Specifically, in a prior art, there is no disclosure regarding influence of the voids in the solder affecting to the cooling performance of the chip, and there is no disclosure of study about an position of the void and a diameter of the void in the solder layer.

SUMMARY OF THE INVENTION

In view of the above-described problem, it is an object of the present invention to provide a semiconductor device having a semiconductor chip on a base through a solder layer.

It is another object of the present invention to provide a method for manufacturing a semiconductor device having a semiconductor chip on a base through a solder layer.

A semiconductor device includes: a base member; a solder layer; and a semiconductor chip disposed on the base member through the solder layer. The chip has an in-plane temperature distribution when the chip is operated. The chip has an allowable maximum temperature as a temperature limit of operation. The in-plane temperature distribution of the chip provides a temperature of the chip at each position of a surface of the chip. The temperature margin at each position is obtained by subtracting the temperature of the chip from the allowable maximum temperature. The solder layer has an allowable maximum diameter of a void at each position, the void being disposed in the solder layer. The allowable maximum diameter of the void at each position becomes larger as the temperature margin at the position becomes larger.

In the above device, the void in the solder layer has a diameter, which is smaller than the allowable maximum diameter of the void. Therefore, the cooling performance of the device maintains the temperature of the chip equal to or lower than the temperature limit of the chip. Thus, the diameter of the void is controlled at each position of the solder layer, so that the device has sufficient cooling performance.

Preferably, the solder layer has an in-plane allowable maximum diameter distribution of the void, which is obtained by applying a relationship between the allowable maximum diameter of the void and the temperature margin at each position to the in-plane temperature distribution of the chip. More preferably, the in-plane temperature distribution of the chip is obtained by actual measurement or simulation, and the relationship between the allowable maximum diameter of the void and the temperature margin at each position is obtained by actual measurement or simulation. Furthermore preferably, the in-plane temperature distribution of the chip has a maximum temperature at a center portion of the chip, and the allowable maximum diameter of the void is proportional to the temperature margin at each position.

Further, a method for manufacturing a semiconductor device, which includes a base and a semiconductor chip disposed on the base through a solder layer, is provided. The method includes the steps of: obtaining an in-plane temperature distribution of the chip when the chip is operated; obtaining a temperature margin at each position of the chip by subtracting a temperature of the chip at the position from an allowable maximum temperature of the chip, wherein the allowable maximum temperature of the chip is a temperature limit of the chip when the chip is operated, and wherein the temperature of the chip at each position is derived from the in-plane temperature distribution; setting solder material on a position of the chip, where the temperature margin at the position is small; and heating the solder material so that the solder layer is formed.

In the above method, the solder near the center portion has small number of the voids, which has a small diameter. Therefore, at the center portion, at which the temperature margin is comparatively small, the diameter of the void is also small. Thus, the above method provides the device having sufficient cooling performance.

Preferably, the method further includes the step of obtaining an allowable maximum diameter of a void at each position in the solder layer, the void being disposed in the solder layer. The allowable maximum diameter of the void at each position becomes larger as the temperature margin at the position becomes larger. More preferably, the method further includes the step of obtaining an in-plane allowable maximum diameter distribution of the void in the solder layer by applying a relationship between the allowable maximum diameter of the void and the temperature margin at each position to the in-plane temperature distribution of the chip.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

The inventors have preliminary studied about a void in a solder layer. Specifically, conventionally, there is no information for limiting a diameter of the void in the solder layer in order to obtain sufficient cooling performance of a semiconductor device. Thus, a position and a diameter of the void in the solder layer are studied.

Figure 1:
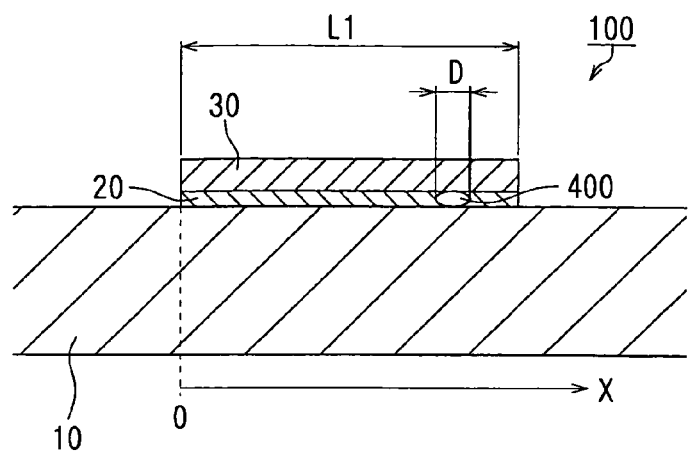
FIG. 1 is a partial cross sectional view showing a semiconductor device according to a first embodiment of the present invention.

As shown in FIG. 1, a semiconductor device 100 according to a first embodiment of the present invention includes a base 10, a semiconductor chip 30, and a solder layer 20. The chip 30 is bonded on the base 10 through the solder layer 20. Here, the dimension of the chip 30 along a direction parallel to a surface of the base 10 is defined as L1. A diameter of a void 40 in the solder layer 20 is defined as D. An X-axis is defined from one end of the chip 30 as an original point of the X-axis. The X-axis extends toward the other end of the chip 30. A position in the X-axis is defined as X. Thus, the position X provides an in-plane position of the chip 20.

The base 10 is made of a circuit board such as a ceramic substrate and a printed circuit board. The base 10 can be made of other plates such as a heat sink and a metallic plate. The solder layer 20 is made of conventional solder such as Sn—Pb solder, Pb-free solder and Sn—Ag solder. The semiconductor chip 30 is an IC chip or a power device chip, on which an electric part such as a transistor is formed by using a conventional semiconductor process. The chip 30 is mounted on the base 10 through the solder material, and then, the solder material is heated and reflowed so that the solder layer 20 is formed. Thus, the chip 30 and the base 10 are bonded with the solder layer 20. In the device 100, the chip 30 generates heat when the chip 30 is operated. The heat from the chip 30 is radiated through the solder layer 20.

In the manufacturing process of the device 100, atmospheric gas may penetrate into the melted solder material when the solder material is reflowed. Thus, the void 40 may be introduced into the solder layer 20. In this case, the heat radiation path through the solder layer 20 is disturbed by the void 40.

Figure 2:
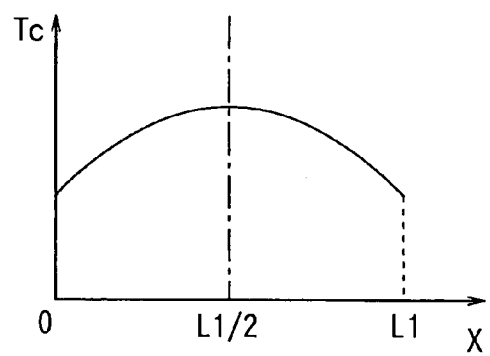
FIG. 2 is a graph showing a relationship between an in-plane position and a temperature of a semiconductor chip in a case where no void is disposed in a solder layer, according to the first embodiment.

In the device 100, when no void 40 is disposed in the solder layer 20, the temperature Tc of the surface of the chip 30 has a certain temperature distribution shown in FIG. 2. Here, the chip 30 is operated so that heat is generated in the chip 30. Thus, the chip has the temperature Tc. This in-plane temperature distribution is obtained by the inventors. FIG. 2 shows a relationship between the temperature Tc of the chip 30 and the in-plane position X of the surface of the chip 30 measured from the one end of the chip 30. Accordingly, FIG. 2 shows an in-plane temperature distribution on the surface of the chip 30. This relationship is obtained by actual measurement with using thermography or by simulation result with using FEM analysis.

The chip 30 is operated so that heat is generated in the chip 30. In this case, the temperature Tc of the chip 30 on the surface of the chip 30 has the maximum temperature at the middle of the chip 30, that is the position X of L1/2. The temperature of the periphery of the chip 30 becomes lower. Thus, the temperature Tc of the chip 30 has the in-plane temperature distribution shown in FIG. 2.

Figure 3:
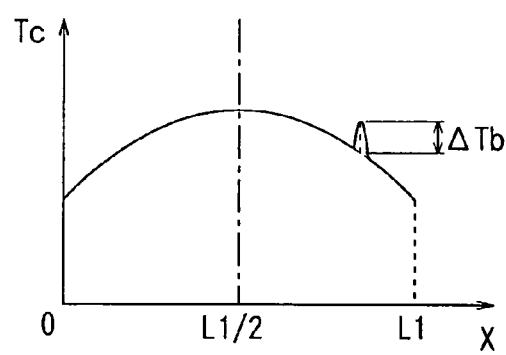
FIG. 3 is a graph showing a relationship between the in-plane position and the temperature of the semiconductor chip in a case where a void is disposed in the solder layer, according to the first embodiment.

However, when the void 40 is disposed in the solder layer 20, the temperature Tc of the chip 30 has a local peak, as shown in FIG. 3. Specifically, the temperature Tc of the chip 30 is locally increased by a local temperature increment ΔTb at a position corresponding to the void 40.

Figure 4:
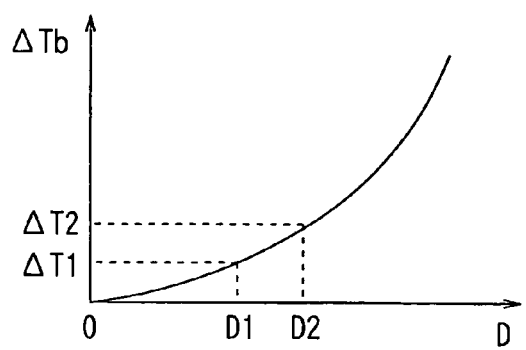
FIG. 4 is a graph showing a relationship between a diameter of the void and a local temperature increment of the chip caused by the void, according to the first embodiment.

FIG. 4 shows a relationship between the diameter D of the void 40 and the temperature increment ΔTb of the temperature Tc of the chip 30. This relationship is obtained by actual measurement with using thermography or by simulation result with using FEM analysis in a case where the solder layer 20 includes the void 40 having different diameter D.

The temperature increment ΔTb of the temperature Tc of the chip 30 correlates with the diameter D of the void 40. As the diameter D of the void 40 becomes larger, the temperature increment ΔTb becomes larger. The inventors observe that the temperature increment ΔTb is the same without depending on the position X of the void 40 in a case where the diameter D of the void 40 is the same.

Here, the allowable maximum temperature of the chip 30 is defined as Tt when the chip is operated. The allowable maximum temperature Tt is a target temperature. When the device 100 can be operated below the target temperature, the device 100 has sufficient cooling performance for operating.

Specifically, the allowable maximum temperature Tt of the chip 30 is set to be an allowable temperature limit of the chip 30. It is preferable that the allowable maximum temperature is the maximum heat generation temperature of the chip 30 when the allowable maximum temperature Tt is determined. In this case, the determination of the allowable maximum temperature Tt is determined in view of the most strict condition.

Figure 5:
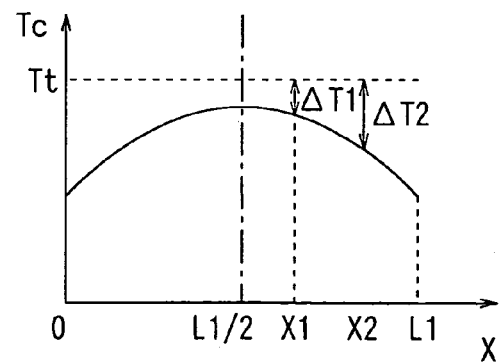
FIG. 5 is a graph showing a relationship between the in-plane position and a temperature margin, according to the first embodiment.

A temperature margin of the chip 30 at the position X is defined as $\Delta T$. Thus, the temperature margin $\Delta T$ is obtained by subtracting the temperature Tc of the chip 30 at the position X from the allowable maximum temperature Tt. Here, the temperature Tc of the chip 30 at the position X is defined as the positional temperature Tc at the position X. Thus, the relationship between the temperature margin $\Delta T$ and the position X on the chip 30 is obtained, as shown in FIG. 5. Since the temperature Tc of the chip 30 has the maximum temperature at the position X of L1/2, i.e., since the temperature Tc of the chip 30 at the center of the chip 30 becomes higher, the temperature margin $\Delta T1$ near the center of the chip 30 becomes smaller, and the temperature margin $\Delta T2$ near the periphery of the chip 30 becomes larger. The temperature margin $\Delta T1$ at the position X1 is smaller than the temperature margin $\Delta T2$ at the position X2.

When the temperature margin $\Delta T$ is larger, the chip 30 does not malfunction even if the temperature increment $\Delta Tb$ is large. Thus, the temperature margin $\Delta T$ at the position X corresponds to the allowable temperature increment $\Delta Tb$. Thus, the allowable maximum diameter Dt of the void 40 at the position X can be calculated from the allowable temperature increment $\Delta Tb$. As the temperature margin $\Delta T$ at the position X becomes larger, the allowable maximum diameter Dt of the void 40 in the solder layer 20 becomes larger. This relationship between the allowable maximum diameter Dt of the void 40 and the position X on the chip 30 is shown in FIG. 6.

Figure 6:
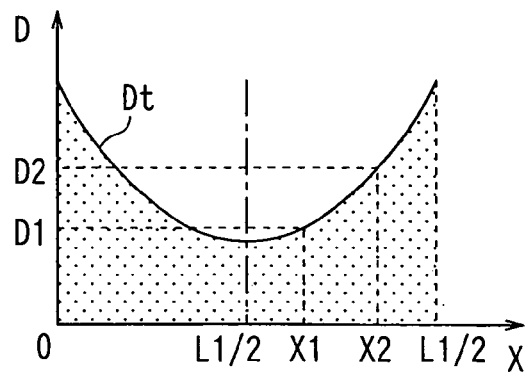
FIG. 6 is a graph showing a relationship between the in-plane position and an allowable maximum diameter of the void, according to the first embodiment.

The hatching area in FIG. 6 represents allowable diameter Dt of the void 40 at the position X. As shown in FIG. 6, when the temperature margin $\Delta T1$ at the position X1 is small, the allowable maximum diameter D1 is small. When the temperature margin $\Delta T2$ at the position X2 is large, the allowable maximum diameter D2 is large. Here, the position X1 is near the center of the chip 30, and the position X2 is apart from the center of the chip 30. Thus, at the position X1, the solder layer 20 can include the void 40 having a diameter equal to or smaller than the diameter D1. At the position X2, the solder layer 20 can include the void 40 having a diameter equal to or smaller than the diameter D2. Accordingly, as the temperature margin $\Delta T$ becomes larger, the allowable maximum diameter Dt of the void 40 becomes larger.

Thus, the allowable maximum diameter Dt of the void 40 in the solder layer 20 can be determined at each position X. Specifically, when the device 100 is manufactured, the temperature distribution on the surface of the chip 30 is determined by the actual measurement or the simulation. Then, the relationship between the diameter D of the void 40 and the local temperature increment $\Delta Tb$ is determined by the actual measurement or the simulation. The allowable maximum temperature Tt of the chip 30 is determined, so that the distribution of the temperature margin $\Delta T$ is calculated at each position X. Then, the allowable maximum diameter Dt of the void 40 is obtained at each position X by applying the temperature margin $\Delta T$ at the position X to the relationship between the diameter D and the local temperature increment $\Delta Tb$. Thus, the allowable maximum diameter Dt of the void 40 at the position X shown in FIG. 6 is obtained.

In the actual manufacturing process, the device 100 is tested by measuring the diameter of the void 40 at each position X. When the measured diameter of the void 40 is larger than the allowable maximum diameter Dt, the device 100 is determined as a defective one. When the measured diameter of the void 40 is equal to or smaller than the allowable maximum diameter Dt, the device 100 is determined as an acceptable one.

In the acceptable device, the diameter of the void 40 is equal to or smaller than the allowable maximum diameter Dt so that the cooling performance of the chip 30 is sufficient. Thus, the chip 30 has sufficient cooling performance so that the temperature of the chip 30 does not exceed over the allowable maximum temperature Tt. Thus, by controlling the diameter of the void 40 at each position X in the solder layer 20, the cooling performance of the chip 30 is improved.

It is preferred that the solder material is applied on a position X, at which the temperature margin $\Delta T$ is comparatively small, when the solder material is reflowed in the manufacturing process of the device 100. Specifically, it is preferred that the solder material is applied on the center of the chip 30, at which the position X is L1/2. It is required for the diameter of the void 40 in the solder layer 20 at the position X near the center of the chip 30 to become smaller. Therefore, the solder material is applied on the center of the chip 30, at which the temperature margin $\Delta T$ is comparatively small. In this case, the solder material expands from the center of the chip 30 during the solder reflow process. This center of the chip 30 is defined as a starting point of expanding.

When the solder material is reflowed, the solder material is melted and expands around the starting point. In this case, when the melted solder material expands from the starting point, atmospheric gas may penetrate into the melted solder material. Thus, the void 40 is introduced into the solder material. Therefore, at the starting point, the void 40 is not introduced into the melted solder material. This is because the solder material expands from the starting point, and therefore, there is no void 40 in the solder material at the starting point.

In this manufacturing method of the device 100, yielding ratio of the acceptable device is improved, so that the manufacturing cost is decreased. This is because the device 100 is acceptable even when the void 40 in the solder layer 20 at the periphery of the chip 30 has a comparatively large diameter, compared with a case where the device 100 is tested under the condition of a constant diameter of the void 40 without depending on the position of the void 40.

(Modifications)

Figure 7:
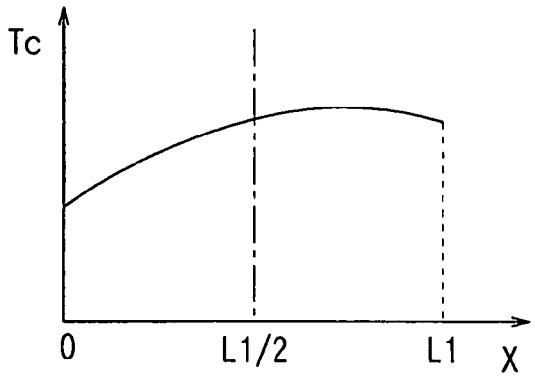
FIG. 7 is a graph showing an in-plane temperature distribution of a semiconductor chip, according to a first modification of the first embodiment.
Figure 8:
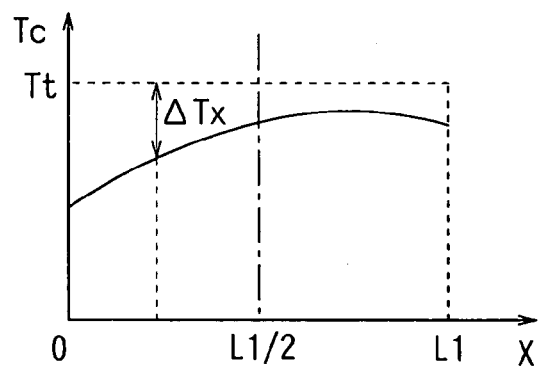
FIG. 8 is a graph showing a relationship between the in-plane position and the temperature margin, according to the first modification of the first embodiment.

FIG. 7 shows an in-plane temperature distribution of a semiconductor device 100 according to a first modification of the first embodiment. FIG. 8 shows a relationship between the position X and the temperature margin $\Delta T$ in the device according to the first modification.

Although the device 100 includes the chip 30 having the temperature distribution shown in FIG. 2, the planar shape of the chip 30 may not be a square, and/or another electric part may be disposed near the chip 30. For example, the planar shape of the chip 30 is polygon such as circle, triangle, and pentagon. In this case, the temperature distribution of the chip 30 does not have a symmetrical distribution shown in FIG. 2. Therefore, the temperature distribution may not have the maximum temperature near the center, and the minimum temperature at the periphery.

Thus, as shown in FIG. 7, the temperature distribution of the chip 30 may be biased. In this case, the temperature of the chip 30 near one periphery of the chip 30 becomes higher. As described above, the temperature margin ΔT at each position X is measured. Then, the allowable maximum diameter Dt of the void 40 at each position X is calculated on the basis of the relationship between the diameter D and the local temperature increment ΔTb shown in FIG. 4. Then, the manufactured device 100 is tested under the condition where the observed diameter of the void 40 at each position X is equal to or smaller than the allowable maximum diameter Dt. Thus, the device 100 having sufficient cooling performance is obtained. It is preferred that the solder material is applied on a position X, at which the temperature margin ΔT is comparatively small, when the solder material is reflowed in the manufacturing process of the device 100.

Figure 9:
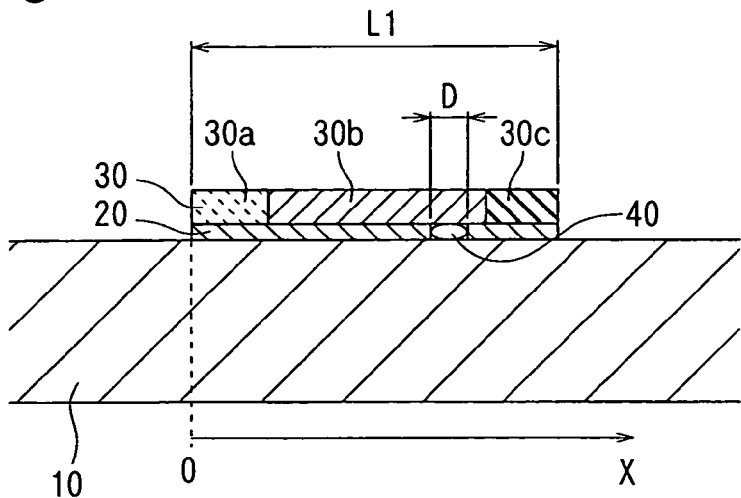
FIG. 9 is a partial cross sectional view showing a semiconductor device according to a second modification of the first embodiment.
Figure 10:
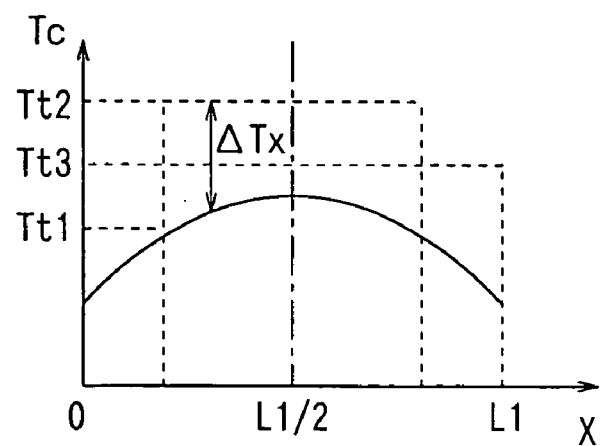
FIG. 10 is a graph showing a relationship between the in-plane position and the temperature margin, according to the second modification of the first embodiment.

FIG. 9 shows a semiconductor device according to a second modification of the first embodiment. FIG. 10 shows a relationship between the position X and the temperature margin ΔT in the device according to the second modification.

In this case, the chip 30 is made of multiple materials. Therefore, the allowable maximum temperature Tt of the chip 30 may be different at each position X. This is because different material has different allowable temperature limit.

In FIG. 9, the semiconductor chip 30 is made of three different materials 30a-30c. The first material 30a has the first allowable temperature limit Tt1, the second material 30b has the second allowable temperature limit Tt2, and the third material 30c has the third allowable temperature limit Tt3. Thus, the allowable maximum temperature Tt at each position X is different, as shown in FIG. 10. As described above, the temperature margin ΔT at each position X is measured. Then, the allowable maximum diameter Dt of the void 40 at each position X is calculated on the basis of the relationship between the diameter D and the local temperature increment ΔTb shown in FIG. 4. Then, the manufactured device 100 is tested under the condition where the observed diameter of the void 40 at each position X is equal to or smaller than the allowable maximum diameter Dt. Thus, the device 100 having sufficient cooling performance is obtained. It is preferred that the solder material is applied on a position X, at which the temperature margin ΔT is comparatively small, when the solder material is reflowed in the manufacturing process of the device 100.

Although the in-plane position and the diameter of the void 40 in the solder layer 20 are defined, the position of the void 40 in a thickness direction (i.e., a vertical direction of the base 10) can be defined as follows. When the void 40 is disposed on the same in-plane position, the allowable maximum diameter Dt of the void 40 becomes larger, as the void 40 is apart from the chip 30. This is because the local temperature increment ΔTb of the chip 30 caused by the void 40 is absorbed by thermal diffusion in the solder layer 20. Specifically, as the distance between the chip 30 and the void 40 becomes larger in the thickness direction of the solder layer 20, the allowable maximum diameter Dt of the void 40 becomes larger.

Second Embodiment

Figure 11:
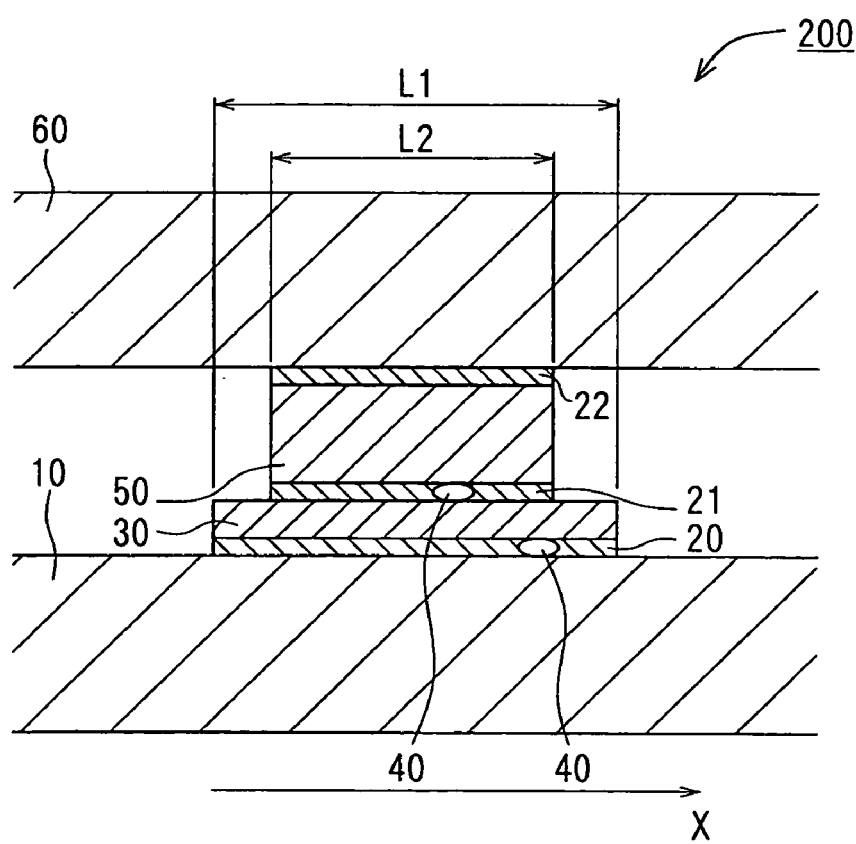
FIG. 11 is a partial cross sectional view showing a semiconductor device according to a second embodiment of the present invention.

A semiconductor device 200 according to a second embodiment of the present invention is shown in FIG. 11. The device 200 further includes an upper side heat sink 60, a first, a second and a third solder layers 20, 21, 22, and a metallic member 50. The chip 30 is mounted on the base 10 as a lower side heat sink through the first solder layer 20. The metallic member 50 is bonded to the chip 30 through the second solder layer 21. The upper side heat sink 60 is mounted on the metallic member 50 through the third solder layer 22. Here, the base 10 as the lower side heat sink, the upper side heat sink 60 and the metallic member 50 have excellent heat radiation. The first, the second and the third solder layers 20, 21, 22 are made of the same material as the solder layer 20 shown in FIG. 1.

In the device 200, the heat generated from the chip 30 is radiated from the lower heat sink as the base 10 downwardly. Further, the heat from the chip 30 is radiated from the upper heat sink 60 through the metallic member 50 upwardly. Thus, the heat from the chip 30 is radiated from both sides of the chip 30.

Here, the dimension L2 of the second solder layer 21 and the dimension L2 of the metallic member 50 may be different from the dimension L1 of the first solder layer 20 and the dimension L1 of the chip 30 in the direction parallel to the base 10. This is required, for example, to retrieve a control wiring of the chip 30.

Not only the void 40 in the first solder layer 20, but also the void 40 in the second solder layer 21 can be defined by the same method as the first embodiment. The first solder layer 20 bonds between the chip 30 and the base 10, and the second solder layer 21 bonds between the chip 30 and the metallic member 50. Thus, the diameter of the void 40 in each of the first and the second solder layers 20, 21 is controlled.

Figure 12:
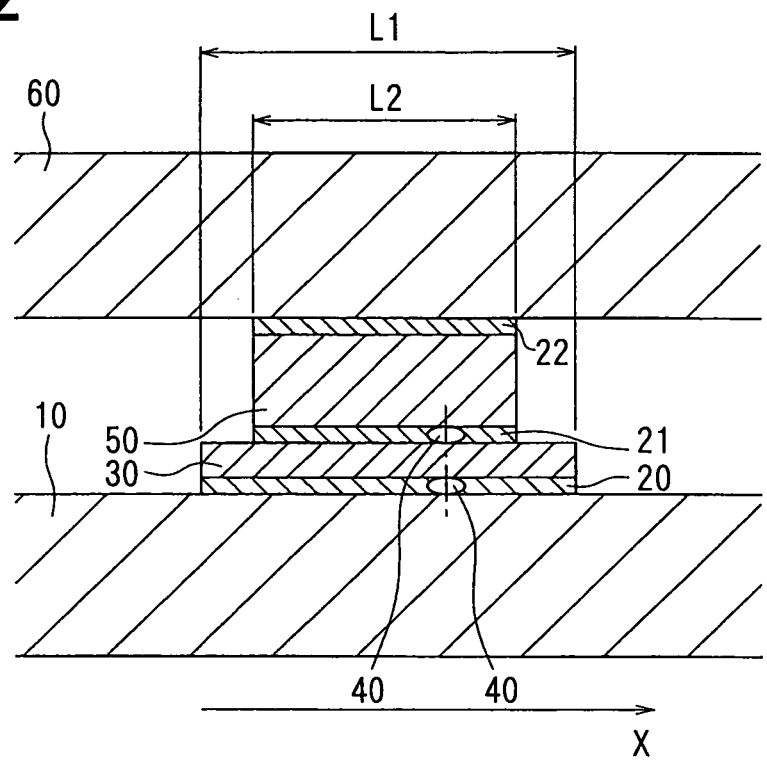
FIG. 12 is a partial cross sectional view showing the semiconductor device in a case where the void in a first solder layer is overlapped with the void in a second solder layer, according to the second embodiment.

As shown in FIG. 12, when the void 40 in the first solder layer 20 is overlapped with the void 40 in the second solder layer 21 at the position X, the local temperature increment ΔTb caused by the voids 40 is doubled. Thus, it is required to define the allowable maximum diameter Dt of the void 40 at the position X smaller than that in a case where the void 40 in the first solder layer 20 is not overlapped with the void 40 in the second solder layer 21.

Here, even when the void 40 in the third solder layer 22, the local temperature increment ΔTb is absorbed by thermal diffusion in the metallic member 50. The third solder layer 22 bonds between the metallic member 50 and the upper heat sink 60. Thus, it is not required to define the dimension of the void 40 in the third solder layer 22. The thermal diffusion effect of the metallic member 50 depends on the thermal conductivity of the metallic member 50. Therefore, as the thermal conductivity of the metallic member 50 becomes higher, the allowable diameter of the void 40 at a certain position X in the third solder layer 22 becomes larger. In this case, the cooling performance of the device is preliminarily decided.

Thus, the semiconductor device 200 is provided as follows. The device 200 includes the base 10, the chip 30, the metallic member 50 and the upper heat sink 60, which are stacked in this order through the first, the second and the third solder layers 20-22. The chip 30 has the in-plane temperature distribution. The temperature margin ΔT is defined by subtracting the temperature of the chip 30 from the allowable maximum temperature Tt. As the temperature margin ΔT at the position X on the in-plane of the chip 30 becomes larger, the allowable maximum diameter Dt of the void 40 in the first and the second solder layers 20, 21 becomes larger.

The diameter of the void 40 in each of the first and the second solder layers 20, 21 is controlled so that the cooling performance of the device 200 is improved. It is preferred that the solder material is applied on the position X, at which the temperature margin ΔT is comparatively small, when the solder material is reflowed in the manufacturing process of the device 200.

(Modifications)

Figure 13:
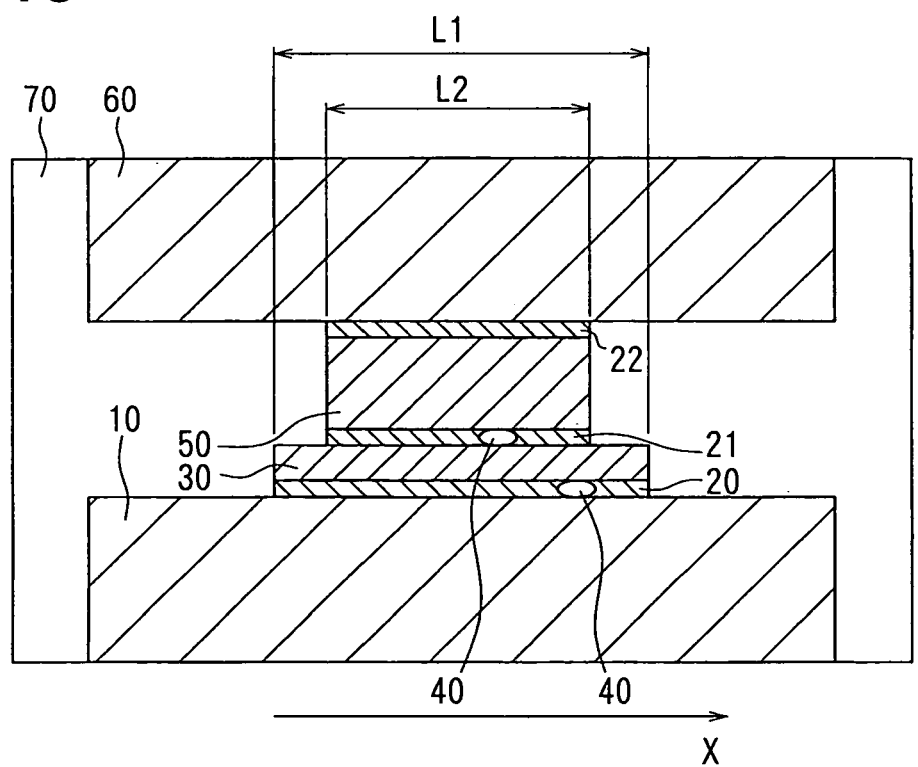
FIG. 13 is a cross sectional view showing a semiconductor device according to a modification of the second embodiment.

A semiconductor device 200 according to a modification of the second embodiment is shown in FIG. 13. Almost all of the device 200 is molded with resin mold 70. The resin mold 70 is made of conventional molding material such as epoxy resin. The resin mold 70 is formed by a transfer molding method with using a metallic mold.

In the device 200, the base 10 as the lower heat sink and the upper heat sink 60 are exposed from the resin mold 70 so that the heat from the chip 30 is radiated outside through the upper and the lower heat sinks 10, 60. Further, the chip 30 is sealed with the resin mold 70, and therefore, reliability and stress resistance of the chip 30 are improved.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a base member;
   a solder layer; and
   a semiconductor chip disposed on the base member through the solder layer, wherein
   the chip has an in-plane temperature distribution when the chip is operated,
   the chip has an allowable maximum temperature as a temperature limit of operation,
   the in-plane temperature distribution of the chip provides a temperature of the chip at each position of a surface of the chip,
   a temperature margin at each position is obtained by subtracting the temperature of the chip from the allowable maximum temperature,
   the solder layer has an allowable maximum diameter of a void at each position, the void being disposed in the solder layer,
   the allowable maximum diameter of the void at each position becomes larger as the temperature margin at the position becomes larger,
   the solder layer has an in-plane allowable maximum diameter distribution of the void, which is obtained by applying a relationship between the allowable maximum diameter of the void and the temperature margin at each position to the in-plane temperature distribution of the chip,
   the in-plane allowable maximum diameter distribution of the void has a maximum diameter at a periphery portion of the chip,
   the in-plane allowable maximum diameter distribution of the void has a minimum diameter at a center portion of the chip, and
   a thickness of the solder layer is equal to or larger than the minimum diameter in the in-plane allowable maximum diameter distribution of the void at the center portion of the chip.

2. The device according to claim 1, wherein the allowable maximum temperature of the chip is a maximum heat generation temperature of the chip.

3. The device according to claim 1, wherein the void at each position in the solder layer has a diameter, which is equal to or smaller than the allowable maximum diameter of the void.

4. The device according to claim 1, wherein the in-plane temperature distribution of the chip is obtained by actual measurement or simulation, and the relationship between the allowable maximum diameter of the void and the temperature margin at each position is obtained by actual measurement or simulation.

5. The device according to claim 4, wherein the in-plane temperature distribution of the chip has a maximum temperature at a center portion of the chip, and the allowable maximum diameter of the void is proportional to the temperature margin at each position.

6. A semiconductor device comprising:
   a base member;
   a solder layer including a void disposed at a position in the solder layer, the void configured to have a diameter less than or equal to a predetermined maximum void diameter; and
   a semiconductor chip disposed on the base member through the solder layer, the semiconductor chip configured to have an in-plane temperature distribution during chip operation in which a temperature of the semiconductor chip varies based upon positions on a surface of the semiconductor chip, a temperature margin at each of the positions is defined by subtracting the temperature of the chip at the position from a maximum allowable chip operation temperature,
   wherein a value of the predetermined maximum void diameter is determined based upon the position of the void and the temperature margin at the position,
   wherein the value of the predetermined maximum void diameter at each of the positions increases as the temperature margin at the position increases,
   wherein the solder layer is configured to have an in-plane allowable maximum diameter distribution of the void based upon a relationship between the predetermined maximum void diameter of the void and the temperature margin at each position to the in-plane temperature distribution of the chip,
   wherein the in-plane allowable maximum diameter distribution of the void has a maximum diameter at a peripheral portion of the chip,
   wherein the in-plane allowable maximum diameter distribution of the void has a minimum diameter at a center portion of the chip, and
   wherein a thickness of the solder layer is equal to or larger than the minimum diameter in the in-plane allowable maximum diameter distribution of the void at the center portion of the chip.

* * * * *